United States Patent [19]

Neese

[11] Patent Number: 4,549,484

[45] Date of Patent: Oct. 29, 1985

[54] THICK FILM SCREEN PRINTING APPARATUS

[75] Inventor: Wayne E. Neese, Hoffman Estates, Ill.

[73] Assignee: GTE Communication Systems Corporation, Phoenix, Ariz.

[21] Appl. No.: 667,676

[22] Filed: Nov. 2, 1984

[51] Int. Cl.$^4$ .................. B41L 13/02; B41L 27/02
[52] U.S. Cl. ................................ 101/123; 101/126
[58] Field of Search ..................... 101/123, 124, 126

[56] References Cited

U.S. PATENT DOCUMENTS

| 2,207,818 | 7/1940 | Perry | 101/123 |
| 2,398,379 | 4/1946 | Kenney | 101/123 |
| 3,834,348 | 9/1974 | Black | 101/123 |
| 3,859,918 | 1/1975 | Dargols | 101/123 |

OTHER PUBLICATIONS

Spaulding, Roller Squeegee Screening, IBM Technical Disclosure Screening, Jul. 1970, vol. 13, No. 2, p. 397.

Primary Examiner—Edgar S. Burr
Assistant Examiner—William L. Klima
Attorney, Agent, or Firm—Anthony Miologos; Peter Xiarhos

[57] ABSTRACT

An improved screen printing apparatus for printing conductive, resistive and insulative films to the surfaces of ceramic or glass substrates. The screen printing apparatus is characterized by a carriage having a substrate to be printed resting thereon and a frame member extending about the periphery of the carriage. A mesh screen having an emulsion layer is affixed to the screen and suspended over the substrate. The improvement comprising a pair of force absorbing members attached to the carriage in a space relationship to and on opposite sides of the substrate. A pair of rolling means are attached to opposite sides of a squeegee holder with each rolling means in registration with a respective force absorbing surface. A squeegee extends from a bottom surface of the squeegee holder intermediate the rolling means. As the squeegee holder is drawn across the screen each rolling means travels along a respective force absorbing member.

5 Claims, 4 Drawing Figures

THICK FILM SCREEN PRINTING APPARATUS

BACKGROUND OF THE INVENTION

This invention relates in general to screen printing apparatus and more particularly to an improved thick film screen printing apparatus for the printing of conductive, resistive, and insulative films to the surfaces of ceramic or glass substrates.

Typically, the screen printing of ceramic substrates is accomplished by first applying a light sensitive emulsion to a mesh screen which is fastened by adhesive to a frame in a manner which places the mesh under tension. This provides that the screen fabric stays taunt within the frame. The light sensitive emulsion is exposed to a photographic positive of the pattern which is desired to be printed. The portion exposed to light undergoes a chemical change which makes it insoluble in water. The screen is then immersed in water and the unexposed portion of the emulsion is washed-out leaving openings in the mesh screen corresponding to the circuit pattern to be printed.

The screen with the printed pattern is mounted to a screen printing machine and the appropriate film in the form of an ink is applied to the screen. A squeegee is then drawn across the surface of the screen which forces ink through the emulsion pattern. The ink contacts the ceramic substrate surface printing the pattern found on the emulsion onto the substrate.

One particular type of printing used in the industry is termed off-contact printing. In the off-contact method the taunt screen is deflected approximately 0.040 inches during the printing stroke. Therefore, in the off-contact method, only the area of the screen contacting the squeegee at any one time is in contact with the substrate being printed.

One of the disadvantageous encountered with this particular method is that substrates are not entirely flat. The larger the substrate the greater the substrates warpage. In order to accomplish quality printing of ceramic substrates in the off-contact printing method a hard material is used for the squeegee. This material is generally neoprene or polyurethane of 70-80 durometer hardness. This hardness allows the squeegee to deflect the screen and force sufficient ink through the openings in the screen material. The pressure required to deflect the screen a break-away distance of 0.040 inch is approximately one pound per linear inch squeegee.

When screening large substrates the squeegee mentioned above is too hard to conform to the surfaces of warped substrates and consequently variations in the thickness and quality of the printing occurs across the face of the substrate. These variations can also be caused by the squeegee not conforming to previously printed patterns on the substrate.

Normally, the ends of the squeegee absorb the greatest force imparted by the deflected screen and therefore an unequal pressure is applied to the squeegee. After a number of uses the ends of the squeegee become rounded changing the shape of the squeegee and causes variations in the printed pattern. Particles of the squeegee which have been worn away enter the thick film ink contamination it, further causing printing variations.

A further disadvantage to the present technique of off-contact printing is the frictional effect of the squeegee on the screen and printing inks. As the squeegee travels across the screen the frictional force tends to pull the screen tauter behind it and loosens the screen in front of it. This effects the quality of the printing by dimensionally distorting the screen pattern. Additionally, the heat generated by the frictional force contributes to the vaporization of the ink thinner thereby changing the thixotropic nature of the ink. This causes additional variations in the printing quality.

Accordingly, it is the object the present invention to provide an improved thick film screen printing apparatus which can closely control the quality of printing on a ceramic substrates and overcome the above mentioned disadvantages.

SUMMARY OF THE INVENTION

In accomplishing the object of the present invention there is provided an improved thick film screen printing apparatus which includes a carriage having a planar top surface and a ceramic substrate attached to the carriage top surface. A frame member extends about the periphery of the carriage and includes a mesh screen attached to frame suspended over the substrate.

The improvement to the screen printing apparatus comprises a pair of force absorbing means attached to the carriage top surface in a spaced relationship to and on opposite sides of the substrate. A squeegee holder including a pair of rolling means are each attached to an opposite end of the squeegee holder. Each rolling means is in registration with a respective one of the absorbing means. A squeegee extends outward of a bottom surface of the squeegee holder intermediate the pair of rolling means.

The squeegee holder is drawn across the screen deflecting the screen onto the substrate and the force absorbing means. Each of the roller means travels along a respective force absorbing means.

A BRIEF DESCRIPTION OF THE DRAWINGS

DESCRIPTION OF THE PREFERRED EMBODIMENT

Figure 1:
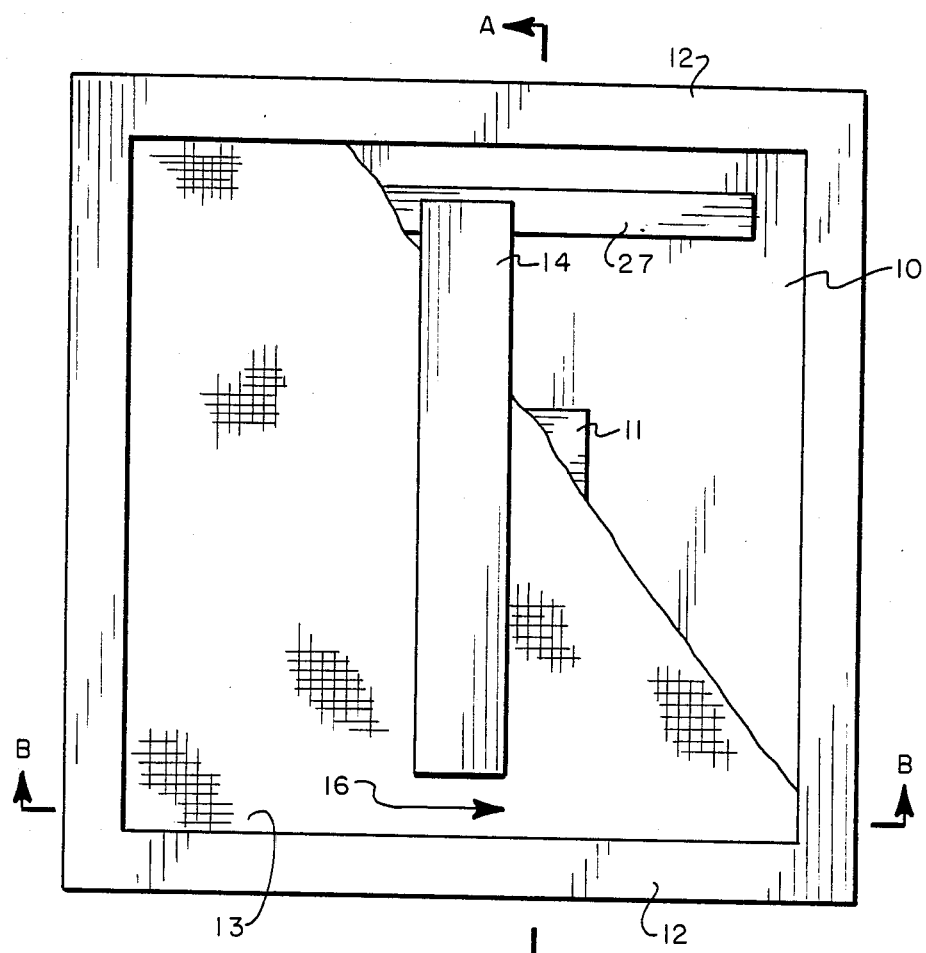
FIG. 1 is a top plan view of a screen printing apparatus embodying the improvements of the present invention.

Turning now to FIG. 1-FIG. 4, a screen printing apparatus of the type to which the invention is used to advantage is illustrated. The screen printing apparatus is characterized by a Carriage 10 having a planar top surface disposed to have a ceramic or glass substrate 11 attached thereon. A frame member 12 extends about the periphery of the Carriage 10, and having a screen mesh material 13 adhesively bonded thereto. An emulsion layer 34 having the the pattern to be printed on the substrate is bonded to the underside of screen 13. A squeegee holder 14 having a squeegee blade 15 is positioned in contact with screen 13 and is movable along the screen in the direction shown by Arrow 16 in FIG. 1. It will be appreciated by those skilled in the art that the squeegee holder is normally attached to the Carriage 10 and is not shown here for matters of clarity.

Figure 2:
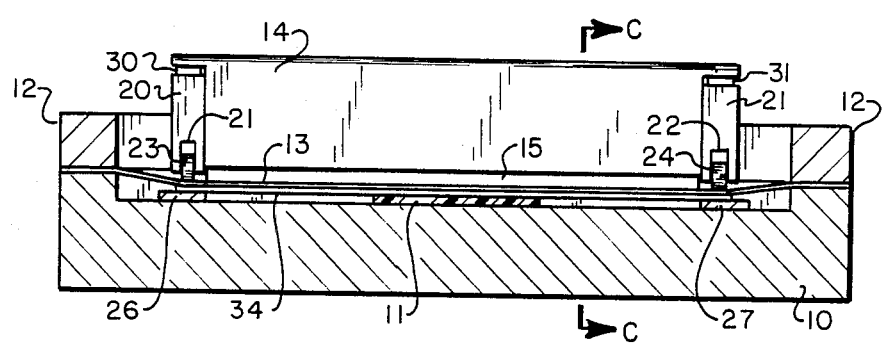
FIG. 2 is a sectional view of the screen printing apparatus of FIG. 1 substantially along line A—A.
Figure 3:
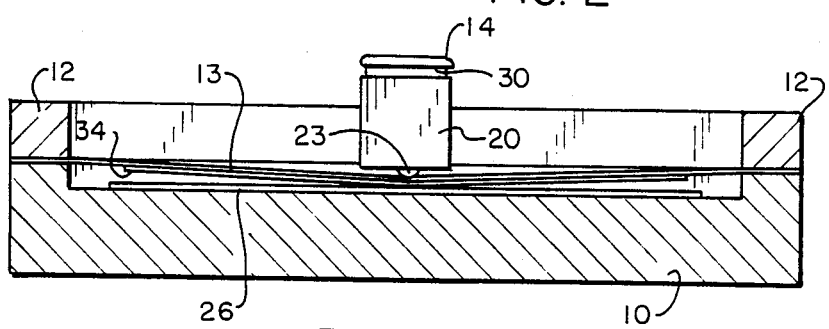
FIG. 3 is a sectional view of the screen printing apparatus of FIG. 2 taken substantially along line B—B.
Figure 4:
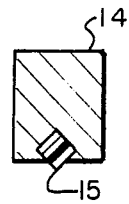
FIG. 4 is a sectional view of the Squeegee Holder of FIG. 2 taken substantially along line C—C.

The improvements comprising the present invention include a pair of roller holders 20 and 21 each positioned on a respective side of the squeegee holder 14. A bottom side of each roller holder 20, 21 includes a cavity 21 and 22. Each cavity 21 and 22 includes a roller 23 and 24, housed in a respective cavity. As can be seen in FIGS. 2 and 3 the rollers 23, 24 extend outward of their respective holders and contact screen 13. A pair of roller support surfaces 26 and 27 rest on carriage 10 top surface and are approximately the same thickness as substrate 11.

Finally, a pair of shims 30, 31 are used for adjusting the squeegee holder and squeegee, thereby controlling the thickness of the printed ink applied to substrate 11.

With renewed reference to FIG. 1–FIG. 3 an explanation of the operation of the present invention will be given. As can be seen in FIG. 3, the method used for printing on the substrate is the off-contact printing method. That is, the screen is deflected approximately 0.040 inches during the printing stroke of the squeegee. In this manner only the area of the screen contacting the squeegee at any one time is in contact with the substrate being printed. The carriage is set up by positioning the substrate to be printed at approximately mid-point of the squeegee. Emulsion 34 having the pattern to be printed to the substrate is attached to the bottom of screen 13. Screen 13 is adhesively bonded to frame 12 and the frame attached to carriage 10 suspending the screen over substrate 11. The squeegee holder 14 including the roller holders 20 and 21 are positioned on the carriage 10 over screen 13 along one extreme edge of the substrate 11. Ink is then applied to the front of the squeegee 15 and the squeegee is drawn across substrate 11. This action deflects screen 13 which makes contact against the substrate with the squeegee forcing the ink through screen 13 and emulsion 34 and printing the pattern on substrate 11.

Rollers 23 and 24 contact screen material 13 and during the printing stroke roll along roller support surfaces 26 and 27 respectively. The rollers transfer most of the force applied to squeegee to surfaces 26 and 27, thereby allowing the use of a softer squeegee material. This allows squeegee 15 to conform to the surface of the substrate whether warped or previously printed. Since the outer edges of squeegee 15 which are subjected to the greatest amount of force are now under rolling action, the frictional distortion of the screen is minimized as well as the frictional heat buildup. This provides for a good quality pattern being printed on the substrate 11 and minimizes vaporization of the ink thinner.

Although the preferred embodiment of the invention has been illustrated, and that form described in detail, it will be readily apparent to those skilled in the art that various modifications may be made therein without departing from the spirit of the invention or from the scope of the appending claims.

What is claimed is:

1. An improved thick film screen printing apparatus including a carriage having a planar top surface, a ceramic substrate attached to said carriage top surface and a frame member extending about the periphery of the carriage, said frame member including a mesh screen attached to said frame member and suspended over said substrate, said improvement comprising:
   a pair of force absorbing means each attached to said carriage top surface in spaced relationship to and on opposite sides of said substrate; and,
   a squeegee holder including a pair of rolling means each attached to an opposite end of said squeegee holder, each rolling means in registration with a respective one of said absorbing means, said mesh screen extending between said pair of rolling means and said pair of force absorbing means, and a squeegee extending outward of a bottom surface of said squeegee holder intermediate said pair of rolling means, whereby said squeegee holder is drawn across said screen deflecting said screen onto said substrate and said force absorbing means and each of said rolling means travels along a respective force absorbing means.

2. An improved thick film screen printing apparatus as claimed in claim 1, wherein: said rolling means comprises a pair of roller holders each including a cavity in a bottom surface, each cavity including a roller housed therein with a portion of each roller extending outward of said bottom surface.

3. An improved thick film screen printing apparatus as claimed in claim 1, wherein: said force absorbing means comprises a pair of generally rectangular members each approximately the same width as said substrate.

4. An improved thick film screen printing apparatus as claimed in claim 1, wherein: said squeegee holder includes squeegee adjusting means for adjusting the working height of said squeegee.

5. An improved thick film screen printing apparatus as claimed in claim 4, wherein: each of said roller holders include a top surface and said adjusting means comprises a shim space between said roller holders top surface and said squeegee holder arranged to accept a shim member thereon vertically adjusting the space between said squeegee and said substrate.

* * * * *